(12) United States Patent
Xu

(10) Patent No.: US 7,032,152 B2
(45) Date of Patent: Apr. 18, 2006

(54) METHOD OF CHANNEL CODING

(75) Inventor: Wen Xu, Unterhaching (DE)

(73) Assignee: Siemens Aktiengesellschaft, Munich (DE)

( * ) Notice: Subject to any disclaimer, the term of this patent is extended or adjusted under 35 U.S.C. 154(b) by 295 days.

(21) Appl. No.: 10/474,172

(22) PCT Filed: Feb. 15, 2002

(86) PCT No.: PCT/DE02/00551

§ 371 (c)(1),
(2), (4) Date: Oct. 6, 2003

(87) PCT Pub. No.: WO02/082662

PCT Pub. Date: Oct. 17, 2002

(65) Prior Publication Data

US 2004/0100995 A1    May 27, 2004

(30) Foreign Application Priority Data

Apr. 5, 2001  (DE) ................................ 101 17 034

(51) Int. Cl.
*G06F 11/00* (2006.01)
*H03M 13/00* (2006.01)
(52) U.S. Cl. ...................... 714/746; 714/779
(58) Field of Classification Search ................ 714/746, 714/747, 752, 779
See application file for complete search history.

(56) References Cited

U.S. PATENT DOCUMENTS 6,085,349 A    7/2000  Stein .......................... 714/778

OTHER PUBLICATIONS

Hindelang et al., Combined source/channel (De-) coding: can A Priori information be used twice?, 2000, IEEE, p. 1208-1212.*
Jiang et al. Multiple description coding VIA scaling rotation transformation, 1999, IEEE, p. 2419-2422.*
Fuldseth et al. Channel-optimized suband video coding for channels with a power constraint, 1997, IEEE, p. 428-431.*
European Telecommunication Standard—Digital Cellular Telecommunications System (Phase 2+) Channel Coding (GSM 05.03 version 5.3.1) pp. 1-38.
ETSI EN 301 709 V7.0.2 (Dec. 1999) Digital Cellular Telecommunications System (Phase 2+); Link Adaption (GSM 05.09 version 7.0.2 Release 1998) pp. 1-13.

* cited by examiner

*Primary Examiner*—Shelly Chase
(74) *Attorney, Agent, or Firm*—Bell, Boyd, & Lloyd LLC

(57) ABSTRACT

A method is provided for channel coding a parameter whose values are correlated with one another to different extents and according to which code words with better distance properties are at least partially associated with the more strongly correlated values of the parameters, and code words with weaker distance properties are at least partially associated with the more weakly correlated values of the parameter.

9 Claims, No Drawings

METHOD OF CHANNEL CODING

BACKGROUND OF THE INVENTION

The present invention relates to a method of channel coding a parameter, of which the values are correlated with each other to different extents.

The breakneck pace of technical development in the field of mobile communications has, in recent years, led to the development of what are known as Adaptive Multirate (AMR) Narrowband and Wideband speech codecs which are designed to be used in future mobile radio standards such as GSM/EDGE and UMTS. An AMR codec makes it possible to adaptively adjust the entire data rate of the data to be transmitted as well as to subdivide the data rate into source and channel coding depending on channel status and network conditions (system load). The main objectives of these types of AMR speech codes are to achieve fixed network speech quality with a variety of channel conditions and to ensure optimum distribution of the channel capacity, taking account of specific network parameters.

An AMR has a number of codec modes (modes) which specify different rates of the coded speech bits. For a restricted transmission bandwidth, an AMR should be able to operate in high-rate modes under good channel conditions and/or in heavily loaded radio cells. Under bad channel conditions it should be dynamically switched into the lower-rate modes. As such, the best speech quality should be produced taking into account the changing channel conditions.

In the GSM/EDGE system, 2 bits (mode bits) that form what is known as the identifier are reserved in each speech frame of 20 ms (both in the full-rate and in the half-rate channel) and can specify up to 4 different modes of the AMR codec (CODEC_MODE_1, CODEC_MODE_2, CODEC_MODE_3 and CODEC_MODE_4). The 2 Bits id(1), id(0) of the identifier are coded via a block code. In this coding, a code word can be assigned to each parameter. The set of modes signaled by the identifier (maximum 4) is designated as the Active Codec Set of the basically 8 codec modes possible with AMR Narrowband. At least this Active Codec Set is known to the base station and the mobile station. Since the 2 mode bits together with the coded speech bits will be transferred within a channel, they also will be referred to as in-band data (see Table 1 and Table 2).

TABLE 1

Channel coding of the parameter "identifier" in adaptive multi rate speech channel at full rate (TCH/AFS) (extract from GSM 05.03, Section 3.9)

| Identifier (defined in GSM 05.09) | Received in-band data id(1), id(0) | Encoded in-band data for SID and RATSCCH frames ic(15), ..., ic(0) | Encoded in band data for speech frames ic(7), ..., ic (0) |
| --- | --- | --- | --- |
| CODEC_MODE_1 | 00 | 0101001100001111 | 00000000 |
| CODEC_MODE_2 | 01 | 0011111010111000 | 10111010 |
| CODEC + MODE_3 | 10 | 1000100001100011 | 01011101 |
| CODEC_MODE_4 | 11 | 1110010111010100 | 11100111 |

TABLE 2

Channel coding of the parameter "identifier" in adaptive multi rate speech channel at half rate (TCH/AHS) (extract from GSM 05.03, Section 3.10)

| Identifier (defined in GSM 05.09) | Received in-band data id(1), id(0) | Encoded in-band data for SID and RATSCCH frames ic(15), ..., ic(0) | Encoded in band data for speech frames ic(7), ..., ic (0) |
| --- | --- | --- | --- |
| CODEC_MODE_1 | 00 | 0101001100001111 | 0000 |
| CODEC_MODE_2 | 01 | 0011111010111000 | 1001 |
| CODEC_MODE_3 | 10 | 1000100001100011 | 0111 |
| CODEC_MODE_4 | 11 | 1110010111010100 | 1110 |

On the receive side, this identifier, also referred to below as a parameter, is first decoded. Furthermore, depending on this decoding mode, and thereby on the current codec mode, the speech bits are determined. If the parameter and, thereby, the codec mode is, for example, incorrectly recognized because of a receive signal with a great deal of noise, the speech frame will be incorrectly decoded and the speech information can be lost.

The Initial codec mode for call setup or handover is defined as follows:

If all 4 codec modes are used, the initial codec mode is the codec mode of the Active Codec Set with the second lowest rate. Otherwise, the codec mode with the lowest rate. In each case, the codec mode changes from frame (k–1) to frame k only to one of its "adjacent" codec modes or remains in the same codec mode (timing correlation of the values of the parameters). A jump to a non-adjacent mode, such as from CODEC_MODE_1 to CODEC_MODE_3, is forbidden (see Table 3). In other words: The parameter "identifier" has a memory, or is correlated from frame to frame (inter-frame correlation or temporal correlation). The memory of the parameter "identifier" leads to a restricted change of the codec modes, or equivalently, of the code words ($CW_1, \ldots, CW_4$) from frame (k–1) to frame k.

TABLE 3

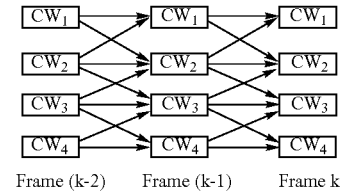

Frame (k-2)   Frame (k-1)   Frame k

The present invention is, accordingly, directed to a method for channel coding a temporally or spatially correlated parameter which allows reliable and low-overhead transmission of the parameter.

SUMMARY OF THE INVENTION

The present invention is, therefore, based on the idea of taking account of the correlation or the "memory" of the values of the parameter in coding the parameter so that it may be used in decoding. To do this, the values of the parameter are mapped to code words in accordance with the correlation of the values of the parameter. In particular, a parameter is coded, or its values are mapped to code words, in such a way that code words with better distance characteristics are assigned to "adjacent" or more closely correlated parameter values. In the example mentioned above, these are the parameter values to which it is possible to change directly from the current parameter value. Code words with worse distance characteristics will be assigned to the less closely correlated ("non-adjacent") parameter values.

The parameter is also to be understood within the context of the present invention as any variable which can bear any values. A "frame" also can be taken to be a point in time or a location point. Since a code word corresponds to/is assigned to precisely one parameter value, the text below frequently no longer makes any distinction between the terms "parameter value" and "code word".

The present invention makes it possible, without increasing complexity (computing effort and memory requirements), to achieve an improved overall performance compared to known channel codes which are optimum for memory-less parameters.

Additional features and advantages of the present invention are described in, and will be apparent from, the following Detailed Description of the Invention.

DETAILED DESCRIPTION OF THE INVENTION

A. Distance Characteristics of Channel Codes (Codes)

As a rule, a channel code features a set of code words. Any part of the code words of a code (mother code) also form a subcode, whereby all code words of the subcode are also code words of the corresponding mother code. The distance (between two code words) is also frequently taken to mean the hamming distance (the number of bit positions), for which the values of the two code words are unequal. Further distances such as the Euclidean distance of two code words also can be used in the present invention.

The set of distances of all possible pairs of the code words of a code form a distribution $\{A(w),$ for $w=d_{min}, d_{min}+1, \ldots$ with minimum Hamming distance $d_{min}\}$, whereby $A(w)$ specifies the number or the (standardized) relative frequency of the pairs of code words with distance w. For a standardized relative frequency the equation $$\sum_{w=d_{min}}^{\infty} A(w) = 1,$$

applies, and the average distance is $$d_{av} = \sum_{w=d_{min}}^{\infty} wA(w)$$

As a rule, a code then exhibits a better distance characteristic than another code with the same code rate and the same dimension of code words if the set of the code words of the code occupy greater minimum and/or average minimum distances. In particular, the distance characteristic can be assessed in accordance with one of the following criteria:

A Code C' with a minimum Hamming distance $d'_{min}$ and relative frequency $\{A'(w)\}$ has a better distance characteristic than a code C with minimum Hamming distance $d_{min}$ and relative frequency $\{A(w)\}$, if $d'_{min} > d'_{min}$ or if $d'_{min} = d_{min}$ and $$d'_{av} = \sum_{w=d'_{min}}^{\infty} wA'(w) > d_{av} = \sum_{w=d_{min}}^{\infty} wA(w).$$

A code C' has a better distance characteristic than a code C, if $d'_{min} > d_{min}$ or if $d'_{min} = d_{min}$ and $A'(W) = A(W)$ for $w = d_{min}, d_{min}+1, \ldots W_0$ $(W_0 \geq d_{min})$ and $A'(W_0) < A(W_0)$.

Distance characteristics of a code such as $d_{min}$ and $d_{av}$ are fundamental for determining the capability of error correction. Codes with better distance characteristics (i.e., greater $d_{min}$ and $d_{av}$), also have better correction capabilities. Until now, good codes mostly have been designed under the condition the data to be coordinated has no memory. When memory is present in data or a parameter, such codes are, as a rule, no longer optimum.

As shown in Tables 1 and 2, the parameter which indicates the codec mode is block coded. For SID (Silence Descriptor and RATSCCH (Robust AMR Traffic Synchronized Control Channel) frames code words of 16 bits in length are produced:

$CW_m = ic(15), \ldots, ic(0)$ with $m = 1, 2, \ldots, 4$.

For the speech frame code words of 8 bits in length are produced in the full rate channel:

$CW_m = ic(7), \ldots, ic(0)$ in the full rate channel and code words of length 4 bits in the half-rate channel:

$CWm = ic(3), \ldots, ic(0)$.

The table below looks at the simple case of a speech frame in the half-rate channel (Table 2). The Hamming distances between all 4 different code words are shown in Table 4.

TABLE 4

Hamming distance of the code words of the block code for the speech frame in TCH/AHS.

| Code word | |
|---|---|
| | $CW_1 = 0000$ |
| | $CW_2 = 1001$ |
| | $CW_3 = 0111$ |
| | $CW_4 = 1110$ |
| Hamming distance | $d(CW_1, CW_2) = 2$ |
| | $d(CW_1, CW_3) = 3$ |
| | $d(CW_1, CW_4) = 3$ |
| | $d(CW_2, CW_3) = 3$ |
| | $d(CW_2, CW_4) = 3$ |
| | $d(CW_3, CW_4) = 2$ |

B. Decoding of the Parameter with/without Memory

A simple approach to decoding the parameter is to calculate the correlation between the code words and the received mode bits which are shown as input vector of the channel soft values. The mode (codec mode) is selected in which there is maximum correlation with the input vector (Maximum Likelihood Decoding).

In the example below, a vector with 4 soft values $r=(r_3, r_2, r_1, r_0,)$ which are quantized with 8 bits, in each case, is received as representative for the coded mode bit. A value of $r_i=+127$, in this case, corresponds to a securely received "0" and a value of $r_i=-127$ to a securely received "1".

Now the correlations $corr_n$ (=correlation between r and $CW_m$) for each mode m=1, . . . , 4 are calculated, with the code word $CW_m$, represented by "+1"/"−1" instead of "0"/"1" (in for example Table 4).

This produces:

$corr_1 = +r_3 + r_2 + r_1 + r_0$ $corr_2 = -r_3 + r_2 + r_1 - r_0$ $corr_3 = +r_3 - r_2 - r_1 - r_0$ $corr_4 = -r_3 - r_2 - r_1 + r_0$ These functions are clarified below in a concrete example. $CW_2 = 1001$ is sent. At the ideal channel the recipient receives the vector $r=(-127, +127, +127, -127)$. The result is:

$corr_1 = 0$ $corr_2 = +508 = Maximum$ $corr_3 = -254$ $corr_4 = -254$

The decoder decides correctly on the mode CODEC_MODE_2 (i.e., $CW_2$).

Under a noisy channel, it is also possible to correct certain errors. If, for example, the vector $(r_3, r_2, r_1, r_0,)=(-6, +2, +3, +5)$, with the bit in bold face "+5" having been reversed, the following applies:

$corr_1 = +4$ $corr_2 = +6 = Maximum$ $corr_3 = -16$ $corr_4 = +6 = Maximum$

In this case, it is no longer possible to decide between $CW_2$ and $CW_4$. However, when the parameter memory is taken into account (e.g., when in the last frame (k−1) CODEC_MODE_1 (=$CW_1$) or CODEC_MODE_2 (=$CW_2$) will already be decoded with high security), the decoder can decide correctly for $CW_2$, since from frame (k−1) to the current frame k a change from $CW_1$ or $CW_2$ to $CW_4$ is not allowed. In this case, the calculation of $corr_4$ is not actually needed.

C. Distance Characteristics for Parameter with/without Memory

If all codec modes (i.e., all code words) at point k are possible for decoding (i.e., no memory present), the minimum Hamming distance is produced for code C with 4 code words in Table 4

$d_{min} = 2$ and the relative frequency

A(w)=2/6 for w=2

A(w)=4/6 for w=3

A(w)=0 else

Thus, $$d_{av} = \sum_{w=d_{min}}^{\infty} wA(w) = 16/6$$

If the parameter at point (k−1) is in CODEC_MODE_1, then only CODEC_MODE_1 and CODEC_MODE_2 are possible at point k. This corresponds to a subcode with only two code words $CW_1$ and $CW_2$, whereby $d_{min} = 2$ A(w)=1 for w=2

A(w)=0 else $$d_{av} = \sum_{w=d_{min}}^{\infty} wA(w) = 2$$

In the decoding, only the correlations $corr_1$ and $corr_2$ are to be taken into account.

In practice, there are other typical situations: $CW_2$ is the actual code word at point (k−1) and $CW_3$ the actual code word at point k, but CW2 is decoded at point (k−1) as $CW_1$. To be able at point k to decode the code word as $CW_3$, $CW_3$ must be contained as a code word in the subcode which is to be taken into account for decoding at point k. Thus, a change from $CW_1$ to $CW_3$ also should be allowed to avoid further decoding errors. However, the probability of such a change in comparison to a normal change, such as $CW_2$ to $CW_3$, is very small. It is further conceivable that even a change from $CW_1$ to $CW_4$, because of a number of consecutive decoding errors, ought also to be possible. The probability of this type of change is, however, so small as to be negligible. For this reason, the distance $d(CW_1, CW_4)$, which is decisive in decoding to distinguish between $CW_1$ and $CW_4$, is not taken into account. To take account of this effect, we define in our example a specific subcode which has all code words of the mother code ($CW_1$, $CW_2$, $CW_3$, $CW_4$); but in observing the distance characteristics, the distance $d(CW_1, CW_4)$ will be ignored. The distance characteristics of this subcode, which generally are not identical to those of the mother code, also can be included for the decoding of the parameter with memory.

In general, for parameters with memory, not only the distance characteristic of the mother code for parameter without memory, but also the distance characteristics of all such subcodes are decisive which are assigned to the groups of the heavily correlated parameter values. Table 5 shows the results of $d_{min}$ and $d_{av}$ of all subcodes for possible known modes at point in time (k−1).

It should be pointed out that the different subcodes (or the corresponding groups of parameter values) can overlap; i.e., the same code words exist in different subcodes. As Table 5 shows, $CW_2$ belongs to subcodes ($CW_1$, $CW_2$) (for CODEC_MODE_1 at point (k−1)), ($CW_1$, $CW_2$, $CW_4$) (for CODEC_MODE_2), etc.

D. Search for the Best Codes for Parameters with Memory

For parameters with memory, the capability of error correction is above all determined by distance characteristics of the individual subcodes. Therefore, the code words for the parameter values should be chosen so as to produce the best possible distance characteristics (e.g., largest $d_{min}$, and $d_{av}$) of all subcodes which are assigned to the correlated parameter values.

TABLE 5

Distance characteristics of the subcodes of a specified block code for decoding the "identifier" for speech frames in TCH/AHS.

| Known codeword in frame k-1 | Subcode to be considered in decoding in frame k | $d_{min}$ | Average distance $d_{av}$ |
|---|---|---|---|
| Unknown | {CW$_1$, CW$_2$, CW$_3$, CW$_4$} | 2 | 8/3 |
| d(CW$_1$, CW$_4$) ignored | {CW$_1$, CW$_2$, CW$_3$, CW$_4$} | 2 | 13/5 |
| CW$_1$ (0000) | {CW$_1$, CW$_2$} | 2 | 6/3 |
| CW$_2$ (1001) | {CW$_1$, CW$_2$, CW$_3$} | 2 | 8/3 |
| CW$_3$ (0111) | {CW$_2$, CW$_2$, CW$_3$} | 2 | 8/3 |
| CW$_4$ (1110) | {CW$_3$, CW$_4$} | 2 | 6/3 |

TABLE 6 distance characteristics of the subcodes of an optimized block code (with CW'$_1$ = CW$_1$, CW'$_2$ = CW$_4$, CW'$_3$ = CW$_3$, CW'$_4$ = CW$_2$) for decoding the "identifier for speech frames in TCH/AHS.

| Known codeword in frame k-1 | Subcode to be considered in decoding in frame k | $d_{min}$ | Average distance $d_{av}$ |
|---|---|---|---|
| Unknown | {CW'$_1$, CW'$_2$, CW'$_3$, CW'$_4$} | 2 | 8/3 |
| D(CW'$_1$, CW'$_4$) ignored | {CW'$_1$, CW'$_2$, CW'$_3$, CW'$_4$} | 2 | 14/5 |
| CW'$_1$ (0000) | {CW'$_1$, CW'$_2$} | 3 | 9/3 |
| CW'$_2$ (1001) | {CW'$_1$, CW'$_2$, CW'$_3$} | 2 | 8/3 |
| CW'$_3$ (0111) | {CW'$_2$, CW'$_2$, CW'$_3$} | 2 | 8/3 |
| CW'$_4$ (1110) | {CW'$_3$, CW'$_4$} | 3 | 9/3 |

If precise information about the probability of the code word change CW$_1$(k-1) CW$_m$(k) (=change of the parameter value) from frame (k-1) to frame k, namely P(CW$_m$(k)|CW$_1$(k$_1$)), available being (1, m, n=1, 2, . . . ), this information can be taken into consideration in code design.

If P(CW$_n$(k)|CW$_1$(k-1))≧P(CW$_M$(k)|CW$_1$(k-1)), the code words CW$_1$, CW$_m$ and CW$_n$ should be generated such that d(CW$_n$, CW$_1$)≧d(CW$_m$, CW$_1$) applies for die Hamming distance. This is a general mathematical formulation of the method described here, if all code words CW$_1$, CW$_m$ and CW$_n$ are determined in this way. For mutually exclusive code words CW$_1$ and CW$_n$P(CW$_m$(k)|CW$_1$(k-1))=0. However, as a rule d(CW$_m$, CW$_1$) should be >0, since otherwise CW$_m$ and CW$_1$ become a single code word.

Refer now to the parameter being in frame (k-1), CW$_2$ (see Table 3). If P(CW$_3$(k)|CW$_2$(k-1))≧P(CW$_1$(k)|CW$_2$(k-1))≧P(CW$_4$(k)|CW$_1$(k-1))=0 (since CW$_1$ and CW$_4$ are mutually exclusive), then CW$_1$, CW$_2$, CW$_3$ and CW$_4$ are generated in such a way that d(CW$_3$, CW2)≧d(CW$_1$, CW$_{22}$)≧d(CW$_1$, CW$_4$).

If the best codes are then selected in accordance with the criterion explained above, what is striking is that, in general, a number of codes which exhibit identical distance characteristics exist. One can create such codes, for example, with block codes by addition of any vector to all code words and/or by simultaneous swapping of random bit positions for all code words.

Table 6 shows the distance characteristics of a code optimized in accordance with the parameter memory with code words CW'$_1$, =CW$_1$CW'$_2$=CW$_4$, CW'$_3$=CW$_3$, CW'$_4$=CW$_2$. This code has a greater capability for error correction than the block code in Table 2. If there is mode CODEC_MODE__1 or CODEC MODE 4 in frame (k-1) the subcode of the optimized block code has a minimum Hamming distance of 3, with which even with a difficult decision an error can be corrected. By contrast, the subcode of the specified block code with a minimum Hamming distance of 2 cannot correct any errors for a difficult decision.

E. Assignment of the Code Words in Accordance with Parameter Memory

The above analysis shows that, because of a number of possible consecutive coding errors (although the probability of this is very small) not only the individual subcodes, but also the mother code should have the best possible distance characteristics to achieve the best possible performance. This is especially important if no close parameter correlation is present.

The present invention proposes a method in which the optimum code is first included for the memory-less parameters, especially those for which the minimum Hamming distance ($d_{min}$) is at a maximum, and then explicitly assigns the code words to different parameter values. In concrete terms, as shown in the previous example, the code words are assigned in such a way that the subcodes for individual groups of the correlated parameter values exhibit the best possible distance characteristics. In this way, the optimized code achieves good performance both for parameters without memory and for parameters with memory.

If further, more precise information such as P(CW$_m$(k) |CW$_1$(k-1)) is available, this information can be taken into account on assignment of the code words. If P(CW$_n$(k)|CW$_1$(k-1))≧P(CW$_m$(k)|CW$_1$(k-1)), the code words CW$_1$, CW$_m$ and CW$_n$, should be assigned where possible, in accordance with the criterion d(CWn, CW$_1$)≧d(CW$_m$, CW$_1$). Since in this case all code words are already defined, we can first sort P(CW$_m$(k)|CW$_1$(k$_-$1)) and d(CW$_m$, CW$_1$) (1≠m) according to their size and subsequently assign the suitable code words to the parameter values.

As shown in Table 4, the minimum Hamming distance is achieved with CW$_1$ and CW$_2$ (or CW$_3$ and CW$_4$). Thus CW$_1$ and CW$_2$ (or CW$_3$ and CW$_4$) should be assigned to the mutually exclusive parameter values CODEC_MODE__1 and CODEC MODE 4. If the parameter values CODEC_MODE__1 and CODEC MODE 4 are assigned to CW$_1$ and CW$_2$, for example, there are still the parameter values CODEC_MODE__2 and CODEC MODE 3, to which CW$_3$ and CW$_4$ can be assigned in each case.

In this way, one obtains (by chance) the same result in Table 6, whereby the subcodes {CW'$_1$, CW'$_2$}, {CW'$_3$, CW'$_4$} have better distance characteristics with $d_{min}$=3 than subcodes {CW$_1$, CW$_2$}, {CW3, CW4} with $d_{min}$=2. The performance for parameters without memory remains unchanged.

With this method the codes for speech frames in TCH/AFS (see tables 7 and 8) and for SID and RATSCCH frames (see tables 9 and 10) can be optimized.

TABLE 7 distance characteristics of the subcodes of the block code specified in GSM 05.03 for decoding the identifier for speech frames in TCH/AFS.

| Known codeword in frame k-1 | Subcode to be considered in decoding in frame k | $d_{min}$ | Average distance $d_{av}$ |
|---|---|---|---|
| Unknown | {CW$_1$, CW$_2$, CW$_3$, CW$_4$} | 5 | 16/3 |
| D(CW$_1$, CW$_4$) ignored | {CW$_1$, CW$_2$, CW$_3$, CW$_4$} | 5 | 26/5 |
| CW$_1$ (00000000) | {CW$_1$, CW$_2$} | 5 | 15/3 |
| CW$_2$ (10111010) | {CW$_1$, CW$_2$, CW$_3$} | 5 | 16/3 |
| CW$_3$ (01011101) | {CW$_2$, CW$_2$, CW$_3$} | 5 | 16/3 |
| CW$_4$ (11100111) | {CW$_3$, CW$_4$} | 5 | 15/3 |

TABLE 8 distance characteristics of the subcodes of an optimized block code (with CW'$_1$ = CW1, CW'$_2$ = CW$_4$, CW'$_3$ = CW$_3$, CW'$_4$ = CW$_2$) for decoding the "identifier for speech frames in TCH/AFS.

| Known codeword in frame k-1 | Subcode to be considered in decoding in frame k | $d_{min}$ | Average distance $d_{av}$ |
|---|---|---|---|
| Unknown | {CW'$_1$, CW'$_2$, CW'$_3$, CW'$_4$} | 5 | 16/3 |
| D(CW'$_1$, CW'$_4$) ignored | {CW'$_1$, CW'$_2$, CW'$_3$, CW'$_4$} | 5 | 27/5 |
| CW'$_1$ (00000000) | {CW'$_1$, CW'$_2$} | 6 | 18/3 |
| CW'$_2$ (11100111) | {CW'$_1$, CW'$_2$, CW'$_3$} | 5 | 16/3 |
| CW'$_3$ (01011101) | {CW'$_2$, CW'$_2$, CW'$_3$} | 5 | 16/3 |
| CW'$_4$ (10111010) | {CW'$_3$, CW'$_4$} | 6 | 18/3 |

TABLE 9 distance characteristics of the subcodes of the block code specified in GSM 05.03 for decoding the "identifier" for SID and RATSCCH frames.

| Known codeword in frame k-1 | Subcode to be considered in decoding in frame k | $d_{min}$ | Average distance $d_{av}$ |
|---|---|---|---|
| Unknown | {CW$_1$, CW$_2$, CW$_3$, CW$_4$} | 10 | 32/3 |
| d(CW$_1$, CW$_4$) ignored | {CW$_1$, CW$_2$, CW$_3$, CW$_4$} | 11 | 53/5 |
| CW$_1$ (0101001100001111) | {CW$_1$, CW$_2$} | 11 | 33/3 |
| CW$_2$ (0011111010111000) | {CW$_1$, CW$_2$, CW$_3$} | 10 | 32/3 |
| CW$_3$ (1000100001100011) | {CW$_2$, CW$_2$, CW$_3$} | 10 | 32/3 |
| CW$_4$ (1110010111010100) | {CW$_3$, CW$_4$} | 11 | 33/3 |

TABLE 10 distance characteristics of the subcodes of an optimized block code (with CW'$_1$ = CW$_1$, CW'$_2$ = CW$_2$, CW'$_3$ = CW$_4$, CW'$_4$ = CW$_3$) for decoding the "identifier" for SID and RATSCCH frames.

| Known codeword in frame k-1 | Subcode to be considered in decoding in frame k | $d_{min}$ | Average distance $d_{av}$ |
|---|---|---|---|
| Unknown | {CW'$_1$, CW'$_2$, CW'$_3$, CW'$_4$} | 10 | 32/3 |
| d(CW'$_1$, CW'$_4$) ignored | {CW'$_1$, CW'$_2$, CW'$_3$, CW'$_4$} | 10 | 54/5 |
| CW'$_1$ (0101001100001111) | {CW'$_1$, CW'$_2$} | 11 | 33/3 |
| CW'$_2$ (0011111010111000) | {CW'$_1$, CW'$_2$, CW'$_3$} | 10 | 32/3 |
| CW'$_3$ (1110010111010100) | {CW'$_2$, CW'$_2$, CW'$_3$} | 10 | 32/3 |
| CW'$_4$ (1000100001100011) | {CW'$_3$, CW'$_4$} | 11 | 33/3 |

Although the present invention has been described with reference to specific embodiments, those of all skill in the art will recognize that changes may be made thereto without departing from the spirit and scope of the present invention as set forth in the hereafter appended claims.

The invention claimed is:

1. A method for channel coding of a parameter, the method comprising the steps of:
   closely correlating, in a manner which is one of temporal and spatial, values of the parameter to different extents; mapping the values of the parameter to code words;
   providing that the code words be at different distances from each other; and
   mapping the values of the parameter to code words such that values of the parameter which are relatively closely correlated to each other are mapped to code words which are at relatively great distances from each other.

2. A method for channel coding of a parameter as claimed in claim 1, wherein mutually exclusive values of the parameter are assigned to code words with relatively bad distance characteristics.

3. A method for channel coding of a parameter as claimed in claim 1, wherein a channel coding is used which is optimum for parameters without memory, with one channel code being used for parameters without memory.

4. A method for channel coding of a parameter as claimed in claim 1, wherein a channel coding is used in which a minimum Hamming distance is maximum, with one channel code being used for which the minimum Hamming distance is maximum.

5. A method for channel coding of a parameter as claimed in claim 1, wherein channel coding is undertaken using a block code.

6. A method for channel coding of a parameter as claimed in claim 1, wherein the parameter for signaling a mode of an Adaptive Multirate Codecs is used.

7. A method for channel coding of a parameter as claimed in claim 1, wherein correlation of parameters is taken into account.

8. A method for channel coding of a parameter, the method comprising the steps of:
   forming a pair of values from a first value of the parameter and a second value of the parameter, wherein the second value of the parameter at least partially differs in how strongly the second value depends on the first value;
   mapping the values of the parameter to code words;
   providing that code words be at different distances from each other; and
   mapping the values of the parameters to code words such that a pair of values including a first value and a second value, for which the second value is more strongly dependent upon the first value, is mapped to the code words which exhibit greater distances to each other than a pair of values for which the second value is less strongly dependent on the first value.

9. A method for channel coding of a parameter, the method comprising the steps of:
   correlating values of the parameter, the correlation being one of temporal and spatial;
   assigning, at least partially, code words with better distance characteristics to more closely correlated values of the parameter; and
   assigning, at least partially, code words with worst distance characteristics to less closely correlated values of the parameter.

* * * * *